United States Patent
Lin et al.

(10) Patent No.: US 9,978,795 B1
(45) Date of Patent: May 22, 2018

(54) SEMICONDUCTOR STRUCTURE

(71) Applicant: UNITED MICROELECTRONICS CORP., Hsin-Chu (TW)

(72) Inventors: Jy-Hwang Lin, Hsin-Chu (TW); Wen-Chieh Wang, Hsinchu (TW); Tien-Shang Kuo, Taoyuan (TW); Fu-Hsuan Chu, Keelung (TW); Hua-Wei Peng, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/401,087

(22) Filed: Jan. 8, 2017

(51) Int. Cl.
*H01L 31/00* (2006.01)
*H01L 27/146* (2006.01)
*H01L 23/00* (2006.01)

(52) U.S. Cl.
CPC ...... *H01L 27/14625* (2013.01); *H01L 23/562* (2013.01); *H01L 27/1462* (2013.01); *H01L 27/14623* (2013.01); *H01L 27/14678* (2013.01); *H01L 27/14643* (2013.01)

(58) Field of Classification Search
None
See application file for complete search history.

(56) References Cited

U.S. PATENT DOCUMENTS

| 7,807,559 | B2 | 10/2010 | Kim | |
|---|---|---|---|---|
| 2009/0146166 | A1* | 6/2009 | Liu | G02B 6/122 257/98 |
| 2010/0244167 | A1* | 9/2010 | Konno | H01L 27/14625 257/432 |
| 2011/0176022 | A1* | 7/2011 | Cho | H04N 5/374 348/222.1 |
| 2013/0200251 | A1* | 8/2013 | Velichko | H01L 31/02327 250/208.1 |
| 2016/0328595 | A1 | 11/2016 | Sun | |

* cited by examiner

*Primary Examiner* — Reema Patel
(74) *Attorney, Agent, or Firm* — Winston Hsu

(57) ABSTRACT

A semiconductor structure includes a substrate, a plurality of image sensing devices formed in the substrate, at least a passivation layer formed on the substrate, a plurality of first metal patterns formed on the passivation layer, a plurality of gaps formed between the first metal patterns, an insulating layer lining the gaps, and a plurality of light-guiding structures respectively formed in the gaps. The light-guiding structures respectively include an anchor portion and a body portion, and bottom surfaces of the anchor portions being lower than top surfaces of the first metal patterns.

20 Claims, 2 Drawing Sheets

SEMICONDUCTOR STRUCTURE

BACKGROUND OF THE INVENTION

1. Field of the Invention

The present invention relates to a semiconductor structure, and more particularly, to a semiconductor structure used in image sensor device.

2. Description of the Prior Art

Solid state image sensors are presently realized in a number of forms including charge-coupled devices (CCDs) and complementary metal-oxide-semiconductor (hereinafter abbreviated as CMOS) image sensors. CMOS image sensors are based on a two dimensional array of pixels that are fabricated by CMOS fabrication techniques. Primarily, CMOS image sensors have certain advantages of low operating voltage, low power consumption, and ability for random access. Furthermore, CMOS image sensors are currently capable of integration with the semiconductor fabrication process. Based on those benefits, the application of CMOS image sensors has increased significantly.

Each CMOS image sensor includes a sensing element such as a photodiode or other photosensitive element and access circuitry formed on a semiconductor substrate, and connected to control circuits by metal lines. And each sensing element is capable of converting a portion of the optical image into an electronic signal.

It is well-known that the quality of an image generated by the conventional image sensors is at least in part determined by the amount of light that reaches the sensing element of each pixel. Therefore, structures that enhance image detection by capturing the light incident on the image sensors and/or directing the light onto the sensing elements are always in need.

SUMMARY OF THE INVENTION

According to an aspect of the present invention, a semiconductor structure is provided. The semiconductor structure includes a substrate, a plurality of image sensing devices formed in the substrate, at least a passivation layer formed on the substrate, a plurality of first metal patterns formed on the passivation layer, a plurality of gaps formed between the first metal patterns, an insulating layer lining the gaps, and a plurality of light-guiding structures respectively formed in the gaps. The light-guiding structures respectively include an anchor portion and a body portion, and bottom surfaces of the anchor portions are lower than top surfaces of the first metal patterns.

According to the semiconductor structure provided by the present invention, and first metal patterns formed on the passivation layer and the anchor portions are provided to securely fix the tall and slender light-guiding structures on the substrate. Such that the light-guiding structures are able to direct the incident light onto the image sensing devices. Consequently, quality of the image generated by the semiconductor structure is improved.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
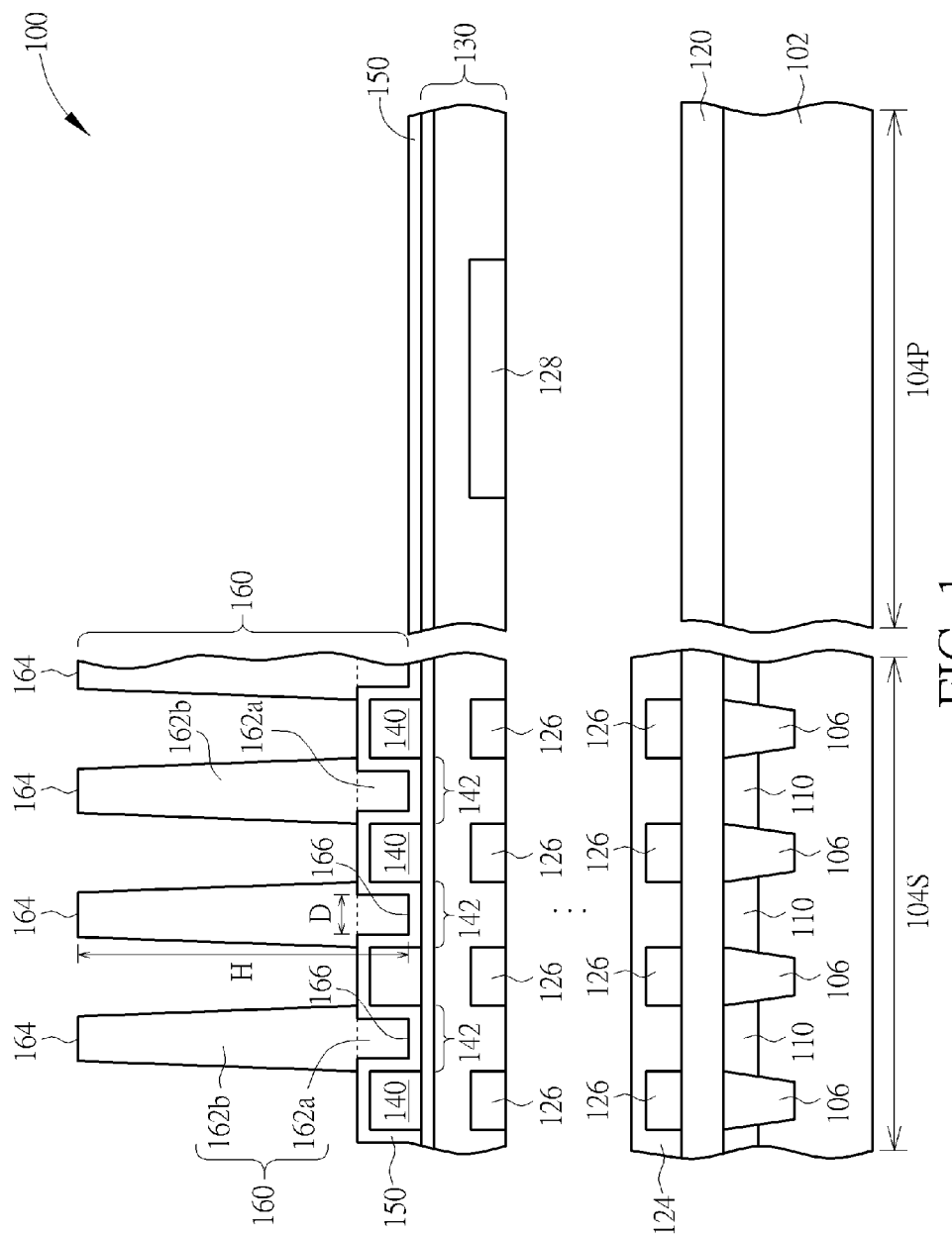
FIG. 1 is a schematic drawing illustrating a semiconductor structure provided by a first preferred embodiment of the invention.

Please refer to FIG. 1, which is a schematic drawing illustrating a semiconductor structure provided by a first preferred embodiment of the invention. As shown in FIG. 1, the semiconductor structure 100 provided by the preferred embodiment includes a substrate 102 having a sensor array region 104S and a peripheral region 104P defined thereon. A plurality of image sensing devices 110 for receiving light are formed in the substrate 102 in the sensor array region 104S, and a plurality of insulators such as shallow trench isolations (STIs) 106 for providing electrical isolations are positioned in between the image sensing devices 110. In the preferred embodiment of the present invention, the image sensing devices 110 can be photodiodes, but not limited to this. Additionally, a plurality of CMOS devices (not shown) are formed on the substrate 102 in the sensor array region 104S for constructing access circuitry. It should be easily realized that though the CMOS devices are omitted in the peripheral region 104P, the CMOS devices can be formed on the substrate 102 in the peripheral region 104P for constructing any required circuit(s). Then, an insulating layer 120 is formed on the substrate 102.

Please refer to FIG. 1 again. The semiconductor structure 100 further includes a plurality of insulating layers 124 and a plurality of metal patterns 126 formed in the insulting layers 122 in the sensor array region 104S. The insulating layers 120 and 124 exemplarily include silicon oxide (SiO) and can be formed by conventional chemical vapor deposition (CVD), but not limited to this. The metal patterns 126 are provided for forming metal interconnects of the CMOS image sensors. Furthermore, the metal patterns 126 are to shield scattering light, therefore the metal patterns 126 are formed correspondingly to the STIs 106. In other words, the image sensing devices 110 and the metal patterns 126 are not overlapped. Additionally, it should be easily realized that though the insulating layer 124 and the metal patterns 126 are omitted in the peripheral region 104p, the insulating layer 124 and the metal patterns 126 can be formed on the substrate 102 in the peripheral region 104p for providing electrical connections. Additionally, a contact pad 128 for providing electrical connection with external elements can be formed in the peripheral region 104P as shown in FIG. 1.

Please still refer to FIG. 1. At least a passivation layer 130 is formed on the substrate 102. Specifically, the passivation layer 130 is formed on the insulating layers 124 to cover the metal patterns 126 and the contact pad 128 as shown in FIG. 1. In the preferred embodiment, the passivation layer 130 includes a multiple layer. For example but not limited to, the passivation layer 130 can include a silicon oxide (SiO) layer and a silicon nitride (SiN) layer. However, any suitable insulating materials can be used to form the passivation layer 130.

Please still refer to FIG. 1. A plurality of metal patterns 140 are then formed on the passivation layer 130, and a thickness of the metal patterns 140 can be, for example but not limited to, 4 micrometers (μm). More important, a plurality of gaps 142 are formed between the metal patterns 140, and the gaps 142 are formed correspondingly to the image sensing devices 110, respectively. In other words, a depth of the gaps 142 can be 4 μm, but not limited to this. An insulating layer 150 is then formed to line the gaps 142. As shown in FIG. 1, the insulating layer 150 covers sidewalls and bottoms of the gaps 142. In other words, the insulating layer 150 covers top surfaces and sidewalls of the metal patterns 140. The insulating layer 150 includes SiO, but not limited to this.

More important, the semiconductor structure 100 provided by the preferred embodiment includes a plurality of light-guiding structures 160 respectively formed in the gaps 142. Furthermore, the light-guiding structures 160 are formed on the insulating layer 150 in the gaps 142. Therefore, the light-guiding structures 160 are also formed correspondingly to the image sensing devices 110, respectively. The light-guiding structures 160 can include transparent material or photoresist such that the light-guiding structures 160 act as light channeling material, and confine and transmit incident lights thereupon to the image sensing devices 110. In some embodiments of the present invention, when the semiconductor structure 100 is used in the fingerprint detecting apparatus, the image sensing devices 110 are used to measure of the unevenness the fingerprint by variable reflection conditions. Therefore, the light-guiding structures 160 are required to be not only light-guidable but also strong enough to against the pressure from fingertip push. Accordingly, the light-guiding structure 160 preferably includes epoxy in those embodiments, but not limited to this. It is found that the insulating layer 150 provides better adhesion to the light-guiding structures 160 than the metal patterns 140 do, therefore the insulating layer 150 are preferably sandwiched between the light-guiding structures 160 and the metal patterns 140. Furthermore, the light-guiding structures 160 can be circular or non-circular in cross-section. As shown in FIG. 1, the light-guiding structures 160 respectively include an anchor portion 162a and a body portion 162b. Specifically, the portion of the light-guiding structures 160 that is above the opening of the gaps 142 is defined as the body portion 162b while the portion lower than the opening of the gaps 142 is defined as the anchor portion 162a. More important, bottom surfaces of the anchor portions 162a are lower than top surfaces of the metal pattern 140. Additionally, the bottom surfaces 166 of the anchor portions 162a can be a flat surface of an arc surface. Consequently, the incident lights are condensed toward the image sensing devices 110, respectively. The light-guiding structures 160 include an aspect ratio of height "H" to diameter "D", and the aspect ratio of the light-guiding structures 160 is equal to or larger than 6:1. For example but not limited, the height H of the light-guiding structures 160 can be 100 μm and the diameter D of the light-guiding structures 160 can be 15 μm. It should be noted that the height H of the light-guiding structure 160 is defined by a top surface 164 of the body portion 162b and a bottom surface 166 of the anchor portion 162a. A height of the anchor portion 162a is smaller than a height of the body portion 162b, and a diameter of the anchor portion 162a is equal to or smaller than a diameter of the body portion 162b. Consequently, the light-guiding structures 160 appear as pillars risen on the substrate 102. Additionally, areas between the light-guiding structures 160 can be filled with a light absorbing material, such as black light absorbing material, but not limited to this. The light absorbing material is provided by prevent cross-talk.

According to the semiconductor structure 100 provided by the preferred embodiment, the metal patterns 140 are provided to form the gaps 142 where the light-guiding structures 160 are accommodated. More important, since the anchor portions 162a are formed in the gaps 142 and secured by the metal patterns 140, the tall and slender light-guiding structures 160 are securely fixed. In other words, collapse that often found in the prior art is avoided by the anchor portions 162a of the light-guiding structures 160.

Figure 2:
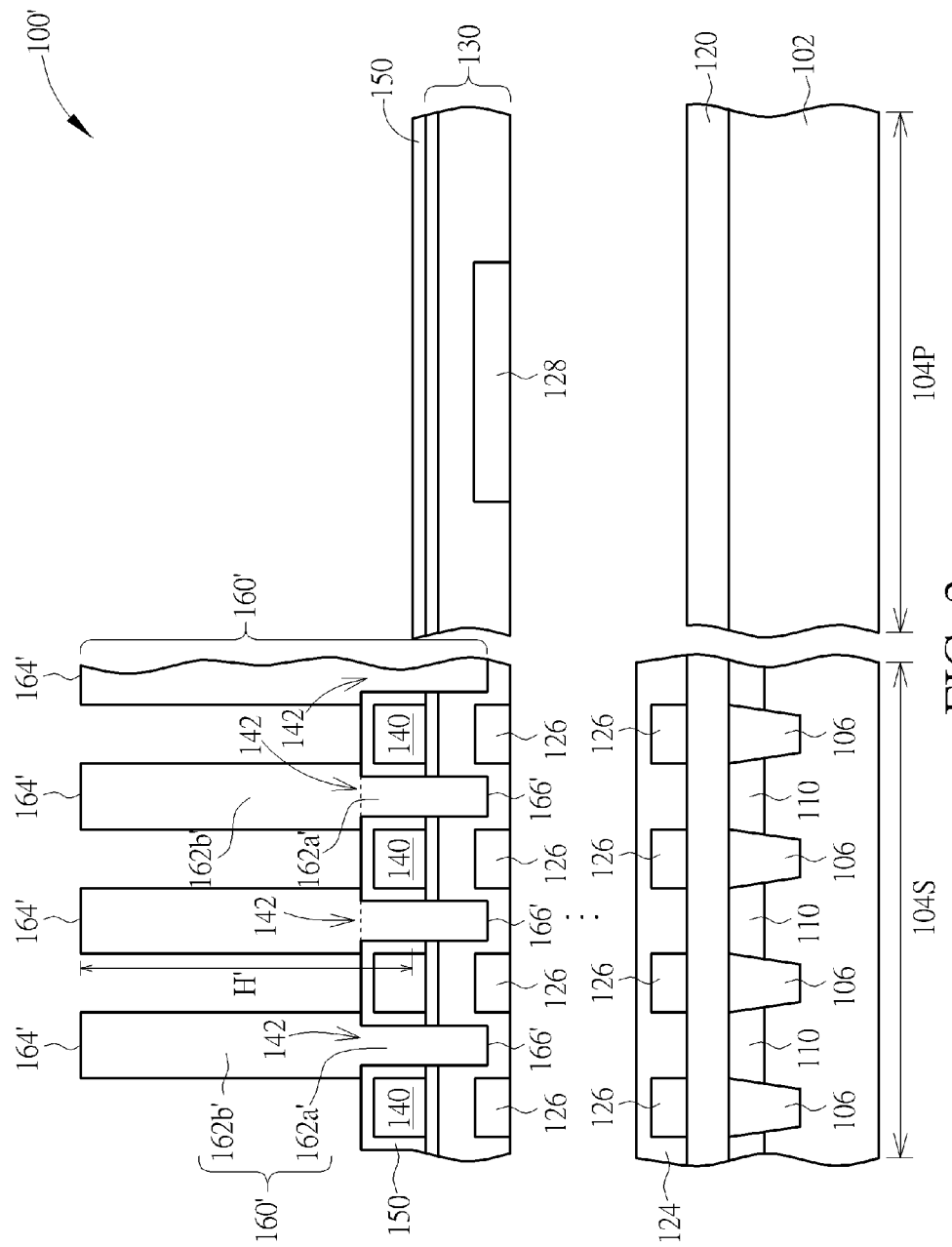
FIG. 2 is a schematic drawing illustrating a semiconductor structure provided by a second preferred embodiment of the invention.

Please refer to FIG. 2, which is a schematic drawing illustrating a semiconductor structure provided by a second preferred embodiment of the invention. It is noteworthy that elements the same in both of the first and second preferred embodiments are designated by the same numerals and can include the same materials, therefore those details are omitted in the interest of brevity. The different between the first and second preferred embodiments is: the semiconductor structure 100' provided by the second preferred embodiment includes a plurality of light-guiding structures 160' formed on the insulating layer 150 in the gaps 142. The light-guiding structures 160' respectively include an anchor portion 162a' and a body portion 162b', and bottom surfaces 166' of the anchor portions 162a' are lower than top surfaces of the metal patterns 140. Furthermore, the bottom surfaces 166' of the anchor portions 162a' are lower than bottom surfaces of the metal patterns 140 that are formed on the passivation layer 130. In some embodiments of the present invention, the bottom surfaces 166' of the anchor portions 162a' can be lower than top surfaces of the topmost metal patterns 126 that are covered by the passivation layer 130.

According to the semiconductor structure 100' provided by the preferred embodiment, the metal patterns 140 are provided to form the gaps 142 where the light-guiding structures 160' are accommodated. The anchor portions 162a' are formed in the gaps 142 and secured by the metal patterns 140, therefore the tall and slender light-guiding structures 160' are securely fixed. In other words, collapse that often found in the prior art is avoided by the anchor portions 162a' of the light-guiding structures 160'. Furthermore, the light-guiding structures 160' include a height H' defined by top surfaces 164' of the body portion 162b' and the bottom surface 166' of the anchor portion 162a'. Since the anchor portions 162a' are formed deeply in the passivation layer 130 as shown in FIG. 2, the height "H" of the light-guiding structures 160' is increased, and an aspect ratio of height "H" to diameter "D" is consequently increased. For example but not limited to, the aspect ratio of the light-guiding structures 160' is to be larger than 6:1. Consequently, light-guiding ability of the light-guiding structures 160' is further improved.

According to the semiconductor structure provided by the present invention, the metal patterns formed on the passivation layer and the anchor portions formed therebetween are provided to securely fix the tall and slender light-guiding structures on the substrate. Such that the light-guiding structures are able to direct the incident light onto the image sensing devices. Furthermore, by forming the anchor portions deep in the passivation layer, the aspect ratio of the light-guiding structures is further increased and thus the light guiding ability is more efficacious. Consequently, the quality of an image generated by the semiconductor structure is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
   a substrate;
   a plurality of image sensing devices formed in the substrate;
   at least a passivation layer formed on the substrate;
   a plurality of first metal patterns formed on the passivation layer;
   a plurality of gaps formed between the first metal patterns;
   a first insulating layer lining the gaps; and
   a plurality of light-guiding structures, wherein each of the plurality of light-guiding structures is formed completely separated from each other on the first metal patterns and each of the plurality of light-guiding structures respectively corresponds to one of the gaps, wherein each of the plurality of light-guiding structures respectively-comprises an anchor portion completely filling up one of the gaps and a body portion directly on the anchor portion, wherein bottom surfaces of the anchor portions of the plurality of light-guiding structures are lower than top surfaces of the first metal patterns.

2. The semiconductor structure according to claim 1, wherein the light-guiding structures comprise photoresist.

3. The semiconductor structure according to claim 2, wherein the light-guiding structures comprise epoxy.

4. The semiconductor structure according to claim 1, wherein each of the plurality of light-guiding structures comprises an aspect ratio of a height to a diameter, and the aspect ratio of each of the plurality of light-guiding structures is larger than 6:1.

5. The semiconductor structure according to claim 4, wherein the height of each of the plurality of light-guiding structure is respectively defined by a top surface of the body portion and the bottom surface of the anchor portion of each of the plurality of light-guiding structures.

6. The semiconductor structure according to claim 1, wherein each of the plurality of gaps respectively corresponds to one of the image sensing devices.

7. The semiconductor structure according to claim 6, wherein each of the plurality of light-guiding structures respectively corresponds to one of the image sensing devices.

8. The semiconductor structure according to claim 1, wherein the first insulating layer directly covers sidewalls and top surfaces of the first metal patterns.

9. The semiconductor structure according to claim 8, wherein the first insulating layer further covers bottoms of the gaps and intervenes between the anchor portion of each of the plurality of light guiding structures and the passivation layer.

10. The semiconductor structure according to claim 1, wherein the first insulating layer comprises silicon oxide.

11. The semiconductor structure according to claim 1, wherein the bottom surfaces of the anchor portions are lower than bottom surfaces of the first metal patterns.

12. The semiconductor structure according to claim 1, wherein each of the plurality of light-guiding structures has a diameter of the anchor portion equal to or smaller than a diameter of the body portion directly on the anchor portion.

13. The semiconductor structure according to claim 1, wherein the passivation layer comprises a multiple-layer structure.

14. The semiconductor structure according to claim 1, further comprising a plurality of second insulating layers formed between the substrate and the passivation layer.

15. The semiconductor structure according to claim 14, further comprising a plurality of second metal patterns formed in the second insulating layers.

16. The semiconductor structure according to claim 15, wherein the bottom surfaces of the anchor portions are lower than top surfaces of the topmost second metal patterns.

17. The semiconductor structure according to claim 8, wherein the body portion of each of the plurality of light-guiding structures covers a portion of the first insulating layer on the top surfaces of the first metal patterns.

18. The semiconductor structure according to claim 1, wherein each of the plurality of light-guiding structures has a sidewall of the anchor portion and a sidewall of the body portion not aligned with the sidewall of the anchor portion.

19. The semiconductor structure according to claim 18, wherein the sidewall of the body portion of each of the plurality of light-guiding structures is not covered by the first insulating layer.

20. The semiconductor structure according to claim 1, wherein the body portion of each of the plurality of light-guiding structures has a tapered profile.

* * * * *